United States Patent [19]

Miyaoka et al.

[11] Patent Number: 5,068,828
[45] Date of Patent: Nov. 26, 1991

[54] SEMICONDUCTOR MEMORY DEVICE

[75] Inventors: Shuuichi Miyaoka, Ohme; Masanori Odaka, Kodair; Toshikazu Arai, Maebashi; Hiroshi Higuchi, Takasaki, all of Japan

[73] Assignees: Hitachi, Ltd.; Hitachi Microcomputer Engineering, Ltd.; Akita Electronics Co., Ltd., all of Tokyo, Japan

[21] Appl. No.: 540,480

[22] Filed: Jun. 19, 1990

Related U.S. Application Data

[63] Continuation of Ser. No. 228,021, Aug. 4, 1988, Pat. No. 4,935,898.

[30] Foreign Application Priority Data

Oct. 2, 1987 [JP] Japan .................................. 62-249578

[51] Int. Cl.$^5$ ............................................... G11C 7/00
[52] U.S. Cl. ................................ 365/189.01; 365/190; 365/203
[58] Field of Search .................... 365/190, 230.03, 154, 365/189.11, 225.6, 203

[56] References Cited

U.S. PATENT DOCUMENTS 4,563,754  1/1986  Aoyama et al. ...................... 365/190
4,685,086  8/1987  Tran .................................... 365/203

OTHER PUBLICATIONS

T. Sakurai et al., "A Low Power 46 ns 256 Kbit CMOS Static Ram with Dynamic Double Word Line," IEEE Journal of Solid-State Circuits, vol. SC-19, No. 5, Oct. 1984, pp. 578-584.
S. Miyaoka et al., A 7 ns/350 mW 64K "EZL Compatible RAM", ISSCC 1987, pp. 132-137, DIgest of Technical Papers.

Primary Examiner—Joseph A. Popek
Attorney, Agent, or Firm—Antonelli, Terry, Stout & Kraus

[57] ABSTRACT

A semiconductor memory device having a plurality of memory arrays in which static memory cells are disposed in a lattice arrangement at intersections of word lines and complementary data lines. The load circuits thereof are characterized as having a varying impedance effected by the combination of a first pair of P-channel MOSFETs disposed between the complementary data lines and a first node supplied with a first supply voltage and kept normally in an ON-state, and a pair of transistors, such as a second pair of P-channel MOSFETs, similarly connected as the first pair of P-channel MOSFETs and which are turned off selectively in accordance with a control signal corresponding to a predetermined selection timing signal in a write-in mode. The semiconductor memory device has a plurality of switching circuits which are coupled between the plurality of complementary data lines and a pair of data read and write lines. Each such switching circuit has a first pair of N-channel MOSFETs for selectively coupling the data input circuit of the memory device to a corresponding pair of complementary data lines via the pair of write data lines during a data write-in mode and a pair of P-channel MOSFETs for selectively coupling the corresponding pair of complementary data lines to the data output circuit via the pair of read data lines during the data read-out mode thereof.

45 Claims, 5 Drawing Sheets

SEMICONDUCTOR MEMORY DEVICE

This is a continuation of application Ser. No. 07/228,021, filed Aug. 4, 1988, now U.S. Pat. No. 4,935,898.

BACKGROUND OF THE INVENTION

The present invention relates to a semiconductor memory device and, more particularly, to a technique effectively applicable to, for example, a bipolar CMOS type random access memory (hereinafter referred to as bipolar CMOS type RAM) composed of bipolar transistors, P-channel field effect transistors (MOSFETs), N-channel MOSFETs and so forth.

There is known a bipolar CMOS type RAM having an ECL (emitter coupled logic) interface so as to be interchangeable with an ECL circuit.

In such bipolar CMOS type RAM, its memory array comprises, for example, high resistance load type N-channel MOSFET memory cells (nMOS memory cells) including high resistance load elements and N-channel MOSFETs, while its peripheral circuit consists of a composite logic gate circuit (hereinafter referred to as bi-CMOS composite logic gate circuit) which is a combination of a bipolar transistor and a CMOS (complementary MOSFET), thereby realizing both a higher operation speed and a reduced power consumption.

Relative to such bipolar CMOS type RAM mentioned, there is proposed an improved method of minimizing the soft error rate while further expediting the write operation by the provision of, between each complementary data line and a high-level supply voltage of the circuit, a variable impedance load circuit is disposed which consists of a parallel connection of a first P-channel MOSFET kept normally in its on-state and a second P-channel MOSFET cut off selectively in the write operation.

With regard to the bipolar CMOS type RAM using variable impedance load circuits, a conventional example is disclosed in "Digest of Technical Papers", ISSCC (International Solid-State Circuits Conference) 1987, pp. 132–133.

FIG. 6 shows an exemplary configuration of a bipolar CMOS type RAM. In this diagram, the bipolar CMOS type RAM includes four memory mats MAT1–MAT4 arranged to occupy the major central area of a semiconductor substrate SUB. Each of the memory mats MAT-1–MAT4 comprises eight memory arrays and eight variable impedance load circuits LC1–LC8 disposed correspondingly to such memory arrays. Each of the load circuits LC1–LC8 comprises a first P-channel MOSFET so designed as to have a relatively small conductance and a second P-channel MOSFET so designed as to have a relatively large conductance and, in a write operation, cut off selectively in accordance with a corresponding selection timing signal sw11–sw18 or sw41–sw48. Each of the selection timing signals sw11–sw18 and sw41–sw48 is formed in a timing generator circuit TG by combining a predetermined address signal with a predetermined write control signal obtained in response to a write enable signal $\overline{WE}$, and then is fed via a corresponding feed path to a corresponding variable impedance load circuit.

SUMMARY OF THE INVENTION

However, it has been found by the present inventor that the following problems are existent in the bipolar CMOS type RAM of FIG. 6. In this example, the selection timing signals sw11–sw18 and sw41–sw48 are formed in the timing generator circuit TG disposed in a portion of the semiconductor substrate SUB and are transmitted to corresponding variable impedance load circuits via a plurality of feed paths having mutually different lengths. Accordingly, the time periods required for the selection timing signals to arrive at the individual load circuits after being outputted from the timing generator circuit TG greatly differ. Consequently, there occurs in a considerable dispersion in the recovery time is required for the corresponding complementary data line to reach a stable high level subsequent to turn-on of the second P-channel MOSFET in the variable impedance load circuit after completion of the write operation, whereby some limitation is rendered unavoidable in reducing the cycle time of the bipolar CMOS type RAM to expedite its operation.

It is therefore an object of the present invention to minimize the dispersion in the recovery time of the variable impedance load circuits and to reduce the cycle time of the bipolar CMOS type RAM or the like having such variable impedance load circuits.

The above and other objects of the present invention and the novel features thereof will be apparent from the following description and the accompanying drawings.

In accordance with the disclosed invention in this application, a brief summary of some typical aspects thereof will be given below. In a bipolar CMOS type RAM or the like having variable impedance load circuits and a plurality of memory arrays, signal generator circuits or control circuits are provided correspondingly to the memory arrays for forming selection timing signals in accordance with predetermined write control signals and corresponding array selection signals and then feeding such timing signals to a plurality of related variable impedance load circuits. Signal relay circuits for transmitting the write control signals by timing generator circuits are, furthermore, provided correspondingly to a predetermined number of such signal generator circuits.

According to the means mentioned above, the lengths of the individual feed paths between the timing generator circuits and the signal relay circuits are rendered mutually equivalent, and the overall length of the feed paths between the signal relay circuits and the corresponding signal generator circuits can be shortened to consequently minimize the dispersion in the recovery time of the variable impedance load circuits as well as to reduce the cycle time of the bipolar CMOS type RAM or the like including the variable impedance load circuits.

DESCRIPTION OF THE PREFERRED EMBODIMENTS

Figure 1:
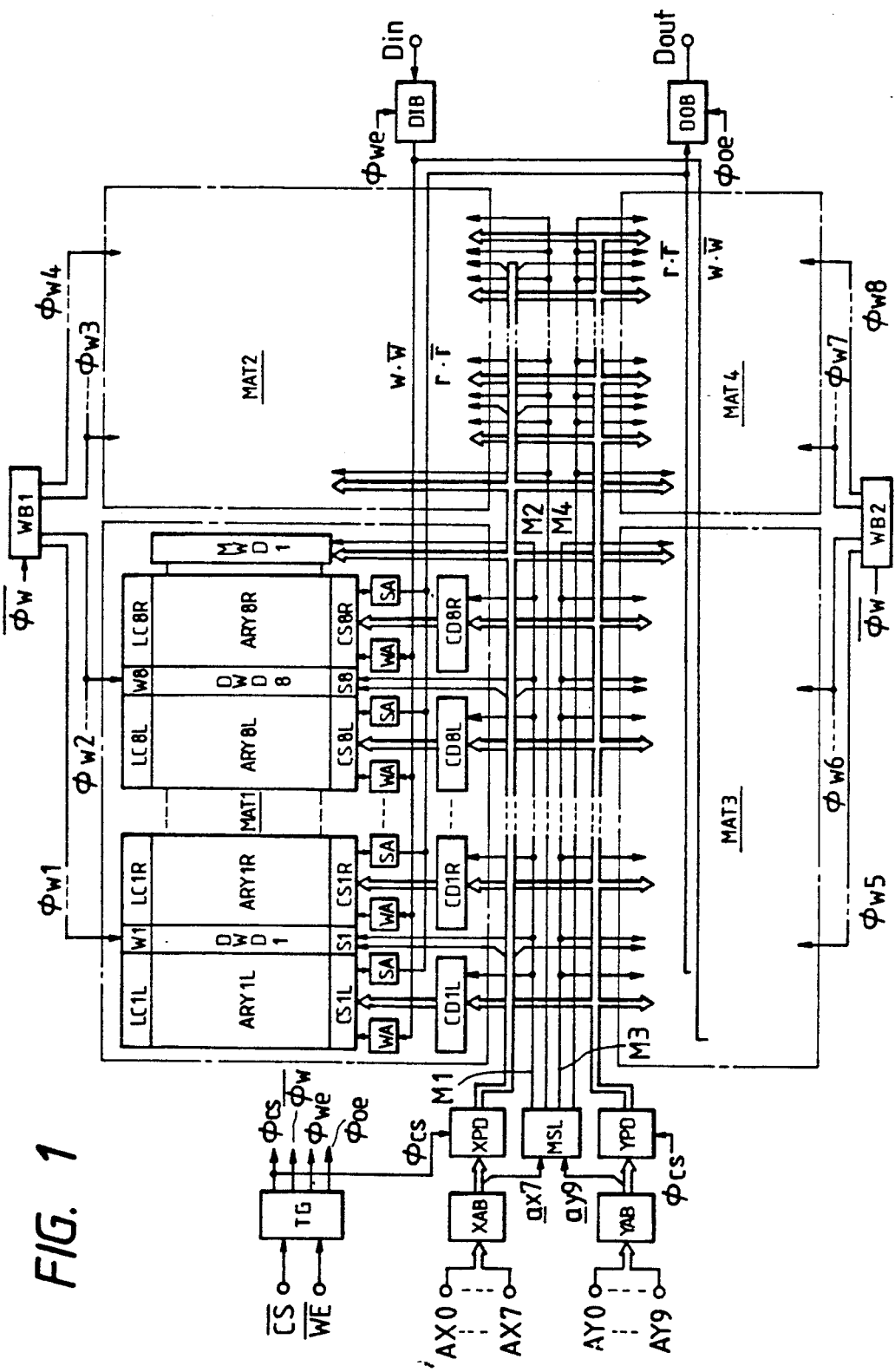
FIG. 1 is a block diagram of an exemplary bipolar CMOS type RAM to which the present invention is applied.

In the block diagram of FIG. 1, showing an exemplary bipolar CMOS type RAM to which the present invention is applied, the circuit elements constituting each block are arranged, although not necessarily restricted thereto, on a single semiconductor substrate of monocrystal silicon or the like by a known technique for manufacture of a bipolar CMOS integrated circuit.

In the bipolar CMOS type RAM of this embodiment, each memory array is composed fundamentally of nMOS memory cells so as to achieve a higher circuit integration density and a smaller power consumption, and its peripheral circuit is composed fundamentally of a bi-CMOS composite logic gate circuit to increase the operation speed. Furthermore, in this bipolar CMOS type RAM, as will be described later, a variable impedance load circuit is provided between each complementary data line and the circuit ground potential (first supply voltage) so as to reduce the soft error rate derived from the a line and so forth while realizing a higher write speed.

The bipolar CMOS type RAM of this embodiment includes, although not restrictive particularly restricted thereto, four memory mats MAT1-MAT4. Each of the memory mats MAT1-MAT4 comprises eight memory arrays divided sequentially in the direction of extension of word lines, and eight variable impedance load circuits disposed correspondingly to the individual memory arrays. The memory arrays and the variable impedance load circuits are divided on the two sides of corresponding word line drive circuits DWD1 -DWD8 to form pairs of memory arrays ARY1L.ARY1R-ARY8L.ARY8R and pairs of variable impedance load circuits LC1L.LC1R-LC8L.LC8R, respectively. Switching signal generator circuits W1-W8 for forming impedance-switching selection timing signals are interposed between such pairs of variable impedance load circuits LC1L.LC1R-LC8L.LC8R. The switching signal generators are supplied with array selection signals from corresponding array selection signal generator circuits S1-S8, respectively, and also with write control signals φw1-w8 from a timing generator TG via a write control signal buffer (signal relay circuit) WB1 or WB2. In this embodiment, each write control signal buffer is disposed substantially at an intermediate position between the corresponding switching signal generator circuits, and a plurality of feed paths between the timing generator circuit TG and the individual write control signal buffers are rendered mutually equivalent in length Accordingly, such configuration minimizes the dispersion in the recovery time of the individual variable impedance load circuits and diminishes the overall length of the selection timing signal feed paths, thereby shortening the cycle time of the bipolar CMOS type RAM equivalently to expedite its operation.

Figure 2:
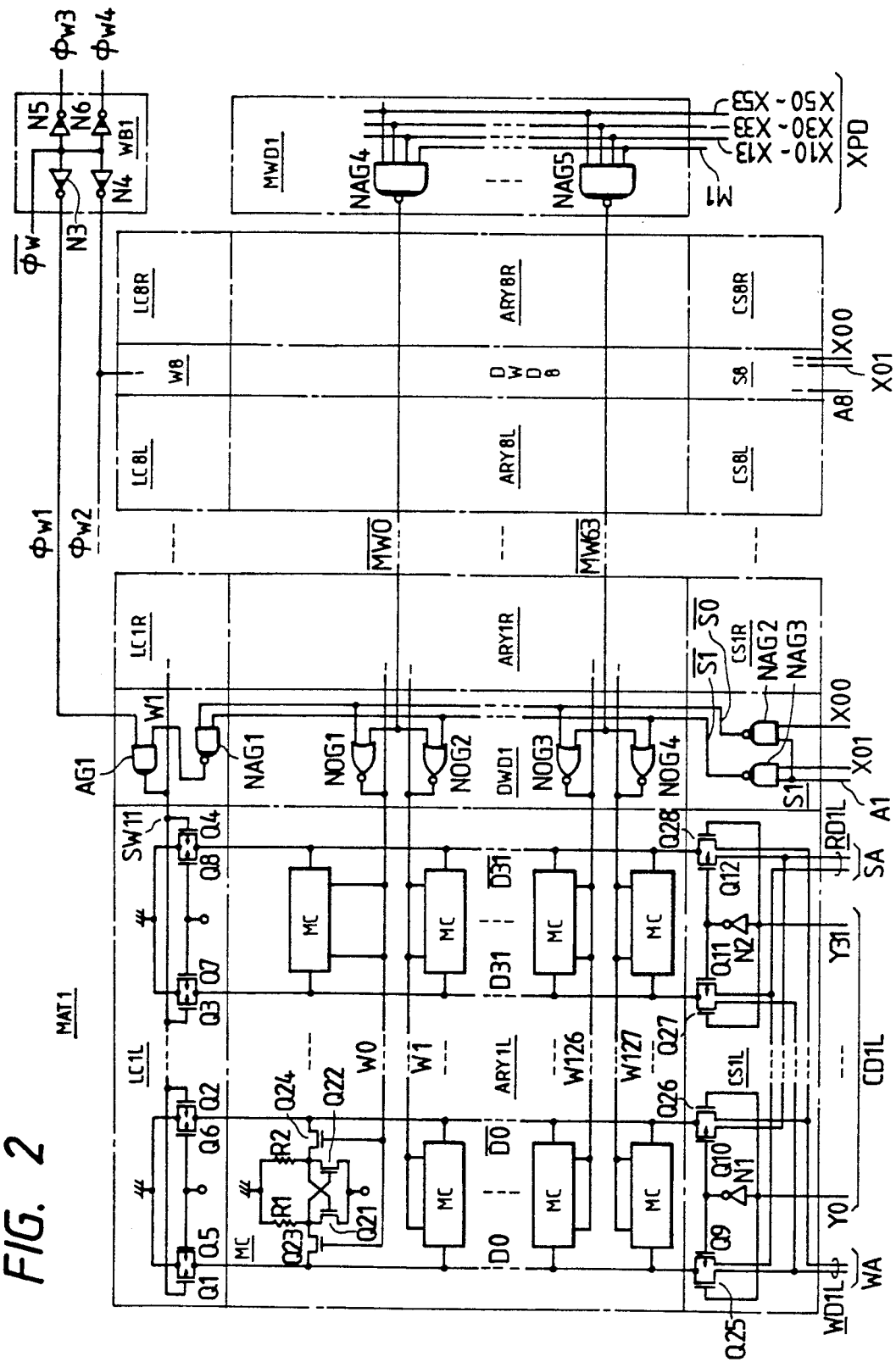
FIG. 2 is a circuit diagram of an exemplary memory mat in the bipolar CMOS type RAM of FIG. 1.
Figure 3:
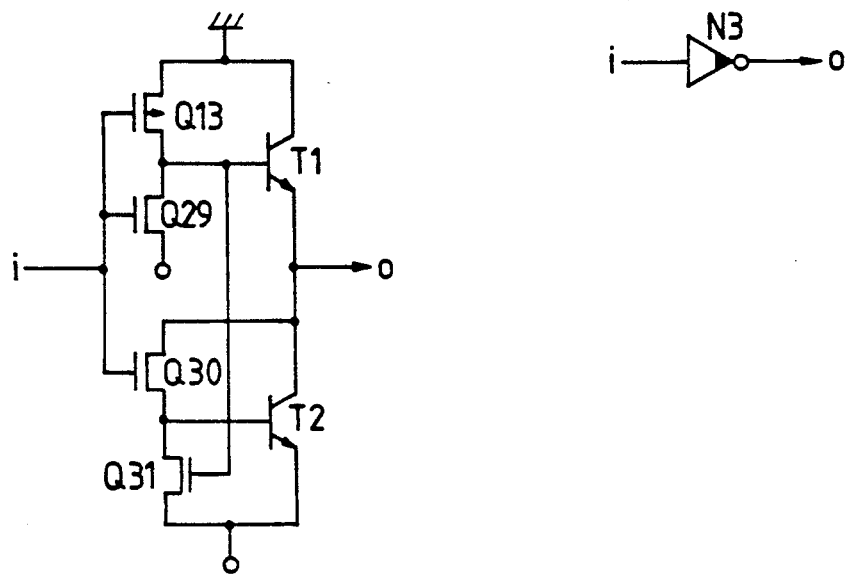
FIG. 3 is a circuit diagram of an exemplary bi-CMOS inverter circuit included in the memory mat of FIG. 2.
Figure 4:
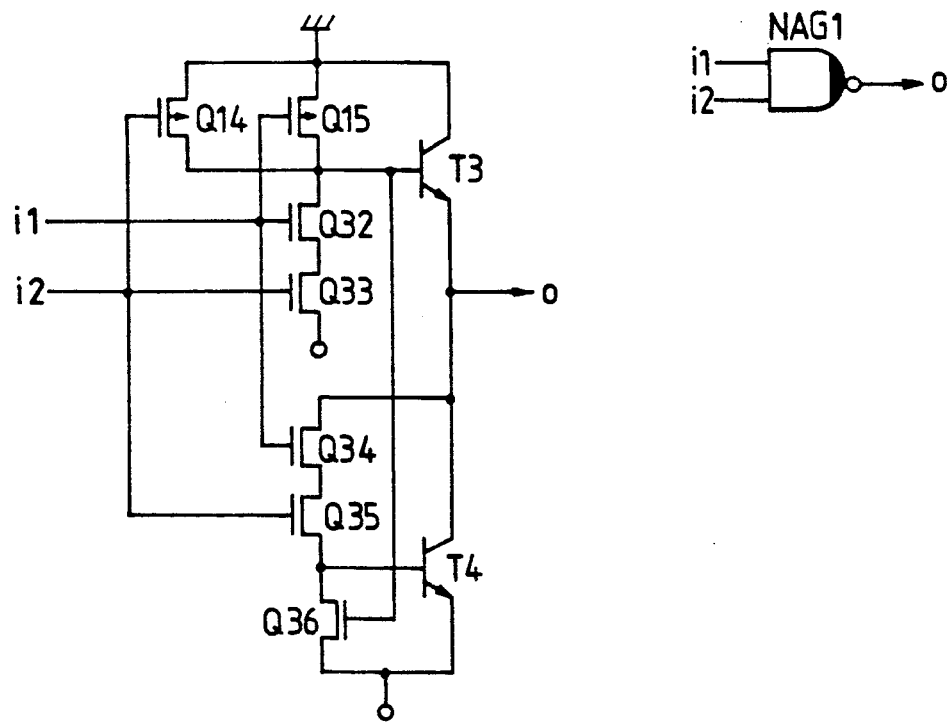
FIG. 4 is a circuit diagram of an exemplary bi-CMOS NAND gate circuit included in the memory mat of FIG. 2.

FIG. 2 shows an exemplary circuit diagram of the memory mat MAT1 in the bipolar CMOS type RAM of FIG. 1, and FIGS. 3 and 4 show exemplary circuit diagrams of the bi-CMOS inverter circuit N3 and the bi-CMOS NAND gate circuit NAG1 included in the memory mat MAT1 of FIG. 2. The memory mat MAT2 is so composed as to be symmetrical with the memory mat MAT1 of FIG. 2. Meanwhile the memory mats MAT3 and MAT4 are composed similarly to the memory mats MAT1 and MAT2, respectively, to form another pair of such memory mats. Hereinafter the constitution and the operation of the bipolar CMOS type RAM in this embodiment will be summarized with reference to these diagrams. It is to be understood that the following description is given specifically on the memory array ARY1 in the memory mat MAT1 taken as an example. As for the memory arrays ARY2-ARY8 in the memory mat MAT1 and the other memory mats MAT2-MAT3, the same may be surmised by analogy. In the reference drawings, any MOSFET marked with an arrow in its channel (back gate) is a P-channel type and is therefore distinguished from the N-channel MOSFET without an arrow.

In FIG. 2, the memory mat MAT1 comprises, although not particularly restricted thereto, eight memory arrays ARY1-ARY8, eight variable impedance load circuits each one respectively, disposed so as to correspond to or be associated with an individual one of the memory arrays, and eight word line drive circuits DWD1-DWD8. In the memory mat MAT1, the memory arrays and the variable impedance load circuits are divided respectively on the two sides of the corresponding word line drive circuits DWD1-DWD8, as mentioned previously, to form pairs of memory arrays ARY1L.ARY1R-ARY8L.ARY8R and LC1L.LC1R-LC8L.LC8R.

As represented by the memory array ARY1L in FIG. 2, each of the memory arrays ARY1L-ARY8L comprises, although not particularly, restricted thereto 128 horizontal parallel word lines W0-W127, 32 sets of vertical parallel complementary data lines D0.$\overline{D0}$-D31.$\overline{D31}$, and 128×32 pieces of static memory cells MC disposed at the intersections of such word lines and complementary data lines. Similarly, each of the memory arrays ARY1R-ARY8R comprises 128 horizontal parallel word lines W0-W127, 32 sets of vertical complementary data lines D32. $\overline{D32}$-D63.$\overline{D63}$, and 128=32 pieces of static memory cells MC interposed at the intersections of such word lines and complementary data lines. Thus, the memory arrays ARY1R- ARY8R are composed to be symmetrical with the corresponding memory arrays ARY1L-ARY8L, respectively, and the word lines W0-W127 are so disposed as to pierce through the pairs of memory arrays ARY1L.ARY1R-ARY8L. ARY8R.

As illustratively shown in FIG. 2, the memory cell MC comprises N-channel type drive MOSFETs Q21 and Q22. The gates and drains of such drive MOSFETs Q21 and Q22 are cross connected to each other. The load resistors R1 and R2 there are each composed of, although not particularly restricted thereto, a polycrystalline silicon layer respectively interposed between the drains of the drive MOSFETs Q21, Q22 and the circuit ground potential, respectively. The sources of the drive MOSFETs Q21 and Q22 are connected to the circuit supply voltage. Although not necessarily restricted thereto, the supply voltage in this example is a negative voltage of −5.2 V. Thus the drive MOSFETs Q21 and Q22 constitute, in combination with the load resistors R1 and R2, a flip-flop which functions as a memory element in the bipolar CMOS type RAM.

The drains of the drive MOSFETs Q21 and Q22, serving as input and output nodes of the flip-flop, are connected via N-channel type transfer gate MOSFETs Q23 and Q24 respectively to the noninverted signal line D0 and the inverted signal lines $\overline{D0}$ of the corresponding complementary data lines. Meanwhile, the gates of such transfer gate MOSFETs Q23 and Q24 are connected in common to the corresponding word line W0.

Each of the other memory cells MC also has the same circuit configuration as that of the aforementioned memory cell MC. In the memory arrays ARY1L-ARY8L and ARY1R-ARY8R of each memory mat, the input and output nodes of 128 memory cells MC arranged on the same column are connected via the corresponding transfer gate MOSFETs to the corresponding complementary data lines D0.$\overline{D0}$- D31.$\overline{D31}$ or D32.$\overline{D32}$-D63.$\overline{D63}$, respectively. The gates of transfer gate MOSFETs of the 32 memory cells MC arranged on the same row of each memory array are connected in common to the corresponding word lines W0-Wm, respectively.

The load resistors R1 and R2 of each memory cell MC have a high resistance adequate to replenish the charge therein so that, when the corresponding drive MOSFET Q22 or Q21 is turned on, its gate voltage is not reduced below the threshold value due to the drain leakage current. Each of the load resistors R1 and R2 composed of a polysilicone layer may be replaced with a P-channel MOSFET as well.

Between the circuit ground potential and the individual complementary data lines constituting the memory arrays ARY1L-ARY8L and ARY1R-ARY8R, as shown illustratively in FIG. 2, there are provided variable impedance load circuits LC1L-LC8L or LC1R-LC8R consisting of P-channel type load MOSFETs Q1.Q5 and Q2.Q6 or Q3.Q7 and Q4.Q8.

In the variable impedance load circuit, the inner load MOSFETs Q5.Q6 or Q7.Q8 (first P-channel MOSFETs) are so designed as to have a relatively small conductance, and the circuit supply voltage is applied continuously to the gates thereof. On the other hand, the outer two load MOSFETs Q1.Q2 or Q3.Q4 (second P-channel MOSFETs) are so designed as to have a relatively large conductance, and a selection timing signal sw11 from the corresponding switching signal generator circuit W1 is selectively fed to the gates thereof. Such selection timing signal sw11 is fed to both variable impedance load circuits LC1L and LC1R forming a pair. As will be described later, the selection timing signal sw11 is normally kept at a low level and is turned on to a high level immediately before a write amplifier WA is driven into operation in accordance with selection of the bipolar CMOS type RAM in a write mode. And the timing signal sw11 is turned back to a low level immediately after the write amplifier WA is placed in its nonoperating state following completion of the writing.

Therefore, the load MOSFETs Q1.Q2-Q3.Q4 are selectively cut off in response to the high level of the corresponding selection timing signal sw11 after the bipolar CMOS type RAM is placed in the write mode. When the load MOSFETs Q1.Q2-Q3.Q4 are cut off, the impedance of each load circuit is rendered relatively greater. Consequently, a predetermined signal amplitude conforming with a write signal fed from the write amplifier WA is obtained in each complementary data line to eventually expedite the writing speed of the bipolar CMOS type RAM. Meanwhile, when the bipolar CMOS type RAM is in a nonselected state or is selected in any mode other than the write mode, the selection timing signal sw11 is maintained at a low level. Therefore the entire load MOSFETs Q1-Q8 are turned on simultaneously, so that the impedance of the load circuit is rendered relatively small. As a result, a relatively high bias voltage is applied to each complementary data line and, when the bipolar CMOS type RAM is in a read mode, there is obtained a read signal of such bias voltage. Thus, it becomes possible to reduce the soft error rate derived from the line and so forth in the bipolar CMOS type RAM.

The switching signal generator circuit W1 comprises, although not particularly restricted thereto, an AND gate circuit AG1 and a NAND gate circuit NAG1. Inverted internal selection signals $\overline{S0}$ and $\overline{S1}$ are fed from the array selection signal generator circuit S1 to a pair of input terminals of the NAND gate circuit NAG1. As will be described later, each of such inverted internal selection signals $\overline{S0}$ and $\overline{S1}$ is turned selectively to a low level when an array selection signal Al and a predecode signal X00 or X01 are both turned to a high level. The predecode signals X00 and X01 are formed selectively and complementarily in accordance with the X address signal AX0 of the least significant bit, thereby enabling the NAND gate circuit NAG1 to function as an OR gate circuit to the noninverted internal selection signal s1 or s2. Needless to say, the output signal of the NAND gate circuit NAG1 is nothing but the array selection signal A1.

In this embodiment, the NAND gate circuit NAG1 is composed of a bi-CMOS composite logic gate circuit, although not particularly restricted thereto. As illustrated in FIG. 4, the NAND gate circuit NAG1 comprises output transistors T3 and T4 disposed in a totempole connection between the circuit ground potential and the supply voltage. Two P-channel MOSFETs Q14 and Q15 to receive input signals i1 and i2 at gates thereof respectively are connected in parallel between the base of the transistor T3 and the circuit ground potential. Furthermore, two N-channel MOSFETs Q32 and Q33 to receive the input signals i1 and i2 at the gates thereof respectively are connected in series between the base of the transistor T3 and the circuit supply voltage. Such MOSFETs Q14, Q15 and Q32, Q33 constitute a two-input CMOS NAND gate circuit. On the other hand, two N-channel MOSFETs Q34 and Q35 to receive the input signals i1 and i2 at the gates thereof respectively are connected in series between the base of the transistor T4 and its collector or output terminal o. Furthermore, an N-channel MOSFET Q36 is connected between the base of the transistor T4 and the circuit ground potential. And the gate of the MOSFET Q36 is connected to the base of the transistor T3.

When either the input signal i1 or i2 is turned to a low level, the base voltage of the transistor T3 becomes a high level which is equivalent to the circuit ground potential. In this stage, the base voltage of the transistor T4 becomes a low level equivalent to the circuit supply voltage, since either the MOSFET Q34 or Q35 is turned off while the MOSFET Q36 is turned on. Consequently the transistor T3 is turned on to cut off the transistor T4, whereby the output signal o of the NAND gate circuit NAG1 is changed rapidly to a high level which is lower than the circuit ground potential by a value corresponding to the base-emitter voltage of the output transistor T3. On the other hand, if the input signals i1 and i2 are both turned to a high level, the base voltage of the transistor T3 becomes a low level equivalent to the circuit supply voltage. In this stage, since the MOSFETs Q34 and Q35 are both turned on while the MOSFET Q36 is turned off, the base voltage of the transistor T4 is changed temporarily to its high level until the high level of the output terminal o is discharged. Consequently the transistor T3 is cut off and instead the transistor T4 is turned on temporarily, whereby the output signal o of the NAND gate circuit NAG1 is discharged rapidly to a low level.

Thus, in the bipolar CMOS type RAM of this embodiment, the driving capability is enhanced to perform a faster operation since the logic gate circuit requiring a relatively great fan-out is constituted by employment of a bi-CMOS composite logic gate circuit.

The output signal of the NAND gate circuit NAG1 is fed to one input terminal of the AND gate circuit AG1. Meanwhile, a corresponding write control signal $\phi w1$ from the write control signal buffer WB1 is fed to another input terminal of the AND gate circuit AG1. Accordingly, the output signal of the AND gate circuit AG1 or the selection timing signal sw11 is selectively turned to a high level when the write control signal $\phi w1$ and the array selection signal A1 are both at a high level, i.e. when a write operation is performed in the bipolar CMOS type RAM with designation of the memory array ARY1. As mentioned previously, in response to change of the selection timing signal sw11 to a high level, the entire load MOSFETs Q1-Q4 of the variable impedance load circuits LC1L and LC1R are turned off simultaneously.

Each of the write control signal buffers WB1 and WB2 (signal relay circuits) comprises four inverter circuits N3-N6, as represented by the buffer WB1 in FIG. 2. The input terminals of such inverter circuits are connected in common, and an inverted timing signal $\overline{\phi w}$ is fed thereto from the timing generator circuit TG. The output signal of the inverter circuit N3 is fed as the aforementioned write control signal $\phi w1$ to the switching signal generator circuits W1-W4 of the memory mat MAT1. Meanwhile the output signal of the inverter circuit N4 is fed as a write control signal $\phi w2$ to the switching signal generator circuits W5-W8 of the memory mat MAT1. Similarly, the output signal of the inverter circuit N5 is fed as a write control signal $\phi w3$ to the switching signal generator circuits W1-W4 of the memory mat MAT2. Meanwhile the output signal of the inverter circuit N6 is fed as a write control signal $\phi w4$ to the switching signal generator circuits W5-W8 of the memory mat MAT2.

As illustrated in FIG. 3, the inverter circuits N3-N6 constituting the write control signal buffers WB1 and WB2 are composed of bi-CMOS inverter circuits. Since each of such bi-CMOS inverter circuits has the same function as that of the bi-CMOS NAND gate circuit shown in FIG. 4, the driving capability is enhanced to increase the operation speed. In this embodiment, the write control signal buffer WB1 is disposed at an intermediate position between the memory mats MAT1 and MAT2, while the write control signal buffer WB2 is disposed at an intermediate position between the memory mats MAT3 and MAT4. The feed paths between such write control signal buffers and the timing generator circuit TG are so designed that the individual signal transfer times thereof are rendered equal to one another by insertion of delay circuits or the like, whereby the lengths of such feed paths are retained equivalently the same. This arrangement is effective for minimizing the dispersion in the recovery time of the variable impedance load circuits as well as for equivalently shortening the relative delay time of the write control signal to the start control signal, in combination with the advantage of decreasing the distance from the individual write control signal buffers WB1 and WB2 to each of the switching signal generator circuits W1-W8. Consequently, the cycle time is further reduced in the bipolar CMOS type RAM of this embodiment.

The word lines W0-W127 constituting the memory arrays ARY1L and ARY1R are connected respectively to the output terminals of the corresponding NOR gate circuits NOG1-NOG4 of the corresponding word line drive circuit DWD1, although not specifically restricted thereto. The word line drive circuit DWD1 comprises 128 NOR gate circuits provided correspondingly to the individual word lines. Such NOR gate circuits are so arranged as to form pairs, wherein one-side input terminals of the paired NOR gate circuits NOG1.NOG2-NOG3.NOG4 are connected to the corresponding inverted main word lines $\overline{MW0}$-$\overline{MW63}$ respectively. The aforesaid inverted internal selection signal $\overline{S0}$ is fed to the other-side input terminals of the NOR gate circuits NOG1-NOG3 of the individual pairs. Meanwhile the aforesaid inverted internal selection signal $\overline{S1}$ is fed to the other-side input terminals of the other NOR gate circuits NOG2-NOG4 of the individual pairs. In this constitution, the word lines W0-W127 relative to the output signals of the NOR gate circuits NOG1-NOG4 are selectively set in a high-level active state when the corresponding inverted main word lines $\overline{NW0}$-$\overline{NW63}$ are in a low-level active state and simultaneously the corresponding inverted internal selection signals $\overline{S0}$ and $\overline{S1}$ are turned to a low level.

The inverted main word lines $\overline{MW0}$-$\overline{MW65}$ are connected respectively to the output terminals of the corresponding NAND gate circuits NAG4-NAG5 of the main word line drive circuit MWD1. The main word line drive circuit MWD1 comprises 64 four-input NAND gate circuits NAG4-NAG5 provided correspondingly to the inverted main word lines MW0-MW63. Although not particularly limited thereto, such NAND gate circuits are constituted by employment of the aforementioned bi-CMOS NAND gate circuits. The mat selection signal M1 is fed in common to the first input terminal of the NAND gate circuits NAG4-NAG5, and predetermined combinations of predecode signals X10-X13 to X50-X53 are fed to the second to fourth input terminals. The mat selection signal M1, together with the mat selection signals M2-M4, is formed in the mat selector circuit MSL by decoding an X address signal AX7 and a Y address signal AY9 each of a most significant bit. The predecode signals X10-X13 to X50-X53 are formed in the predecoder XPD by decoding the X address signals through combination of AX1 with AX2, AX3 with AX4, and AX5 with AX6 relative to every two bits thereof, as will be described later.

The inverted main word lines $\overline{MW0}$-$\overline{NW63}$ related to the output signals of the NAND gate circuits NAG-4-NAG5 in the main word line drive circuit MWD1 are selectively set in a low-level state when the corresponding mat selection signal M1 is turned to a high level and the corresponding combinations of predecode signals X10-X13 to X50-X53 are turned simultaneously to a high level. As mentioned previously, such inverted main word lines MW0-MW4W63 are connected to one-side input terminals of the corresponding paired CMOS NOR gate circuits NOG1-NOG2-NOG3-.NOG4 of the word line drive circuits DWD1-DWD8 in the memory mat MAT1.

As shown in FIG. 1, the predecoder XPD receives a timing signal $\phi cs$ from the timing generator circuit TG and also receives, from an X address buffer XAB which will be described later, complementary internal address signals ax0-ax6 composed of seven bits with the exception of the most significant bit. (Here the complementary internal address signal ax0, for example, represents both the noninverted internal address signal ax0 and the inverted internal address signal $\overline{ax0}$. This applies to the following description as well.)

The predecoder XPD is selectively driven into operation in accordance with the timing signal φcs. In such operating state, the predecoder XPD functions to decode the complementary internal address signals by combining ax0, ax1 with pax2, ax3 with ax4, and ax5 with ax6 relative to every one or two bits thereof, hence forming predecode signals X00-X01, X10-X13, X30-X33 and X50-X53, respectively.

The X address buffer XAB comprises, although not necessarily limited thereto, 8 level discriminator circuits provided correspondingly to external terminals AX0-AX7, and a total of 16 ECL-to-CMOS level converter circuits provided at a rate of two to each of the level discriminator circuits. Such level discriminator circuits and level converter circuits are constituted fundamentally of bipolar CMOS composite circuits.

The level discriminator circuits of the X address buffer XAB discriminate the levels of X address signals AX0-AX7, which are inputted with ECL levels via corresponding input emitter follower circuits from the external terminals AX0-AX7, in accordance with a predetermined reference potential and produce complementary internal signals. Then the complementary internal signals thus obtained are converted to CMOS levels by the corresponding level converter circuits of the X address buffer XAB, thereby becoming the aforementioned complementary internal address signals ax0-ax7. As described previously, the complementary internal address signals ax0-ax6 are fed to the predecoder XPD, while the complementary internal address signal ax7 of the most significant bit is fed to the mat selector circuit MSL.

On the other hand, the complementary data lines D0.D0-D31.D31 constituting the memory array ARY1L are connected, as shown illustratively in FIG. 2, to the corresponding switching MOSFETs Q9.Q25 and Q10.Q26-Q11.Q27 and Q12.Q28 of the corresponding column switch CS1L. The P-channel type switching MOSFETs Q9-Q12 of the column switch CSIL are connected in common to the corresponding read complementary common data line $\overline{RD1L}$. (Here the read complementary common data line $\overline{RD1L}$, for example, represents both the noninverted common data line RD1L and the inverted common data line $\overline{RD1L}$. This applies to the following description as well.) Meanwhile, the N-channel type switching MOSFETs Q25-Q28 of the column switch CS1L are connected in common to the corresponding write complementary common data line $\overline{WD1L}$.

The gates of the P-channel MOSFETs Q9.Q10-Q11.Q12 of the column switch CS1L are connected in common to each other and further to the output terminals of the corresponding CMOS inverter circuits N1-N2. Meanwhile, the gates of the N-channel MOSFETs Q25.Q26-Q27.Q28 are connected in common to each other and further to the input terminals of, the corresponding inverter circuits N1-N2. The corresponding data line selection signals Y0-Y31 are fed from the column address decoder CD1L to the input terminals of the inverter circuits N1-N2 respectively.

The switching MOSFETs Q9.Q25 and Q10.Q26-Q11. Q27 and Q12.Q28 of the column switch CS1L are simultaneously turned on when the corresponding data line selection signals Y0-Y31 are selectively turned to a high level, thereby selectively connecting the corresponding complementary data lines D0.$\overline{D0}$-D31.$\overline{D31}$ to the write complementary common data line $\overline{WD1L}$ and the read complementary common data line $\overline{RD1L}$.

Similarly, the column switch CS1R comprises 32 sets of switching MOSFETs provided correspondingly to the complementary data lines D32.$\overline{D32}$-D63.$\overline{D63}$ of the memory array ARY1R. In accordance with unshown data line selection signals Y32-Y63 fed from the corresponding column address decoder CD1R, furthermore, the column switch CS1R selectively connects the complementary data lines D32. $\overline{D32}$-D63.$\overline{D63}$ of the memory array ARY1R to the write complementary common data line $\overline{WD1R}$ and the read complementary common data line $\overline{RD1R}$.

As shown in FIG. 1, the column address decoders CD1L and CD1R receive the aforesaid ma selection signal M1 from the mat selector circuit MSL and also predecode signals Y00-Y03, Y20-Y23 and Y40-Y41 from the predecoder YPD. Such decoders further receive the corresponding array selection signal A1 and the left-right selection signals SL and SR from the predecoder YPD. Although not restrictive particularly, the predecode signals Y00-Y03, Y20-Y23 and Y40-Y41 are formed by decoding the Y address signals through combination of AY0 with AY1, AY2 with AY3 and AY4 relative to every one or two bits thereof, as will be described later. Meanwhile the array selection signal A1, together with the array selection signals A2-A8, is formed by decoding the 3-bit Y address signals AY-6-AY8, and the left-right selection signals SL and SR are selectively formed in accordance with the Y address signal AY5.

The column address decoders CD1L and CD1R are selectively driven into operation in accordance with the array selection signal A1 and the left-right selection signals SL and SR. In such operating condition, the column address decoders CD1L and CD1R selectively turn the corresponding data line selection signals Y0-Y31 or Y32-Y63 to a high-level active state in response to the predecode signals Y00-Y03, Y20-Y23 and Y40-Y41.

The predecoder YPD receives the aforesaid timing signal φcs from the timing generator circuit TG, and also receives from the Y address buffer YAB the complementary internal address signals ay0-a8 composed of 9 bits except the most significant bit. The predecoder YPD is selectively driven into operation in accordance with the timing signal φcs. In this operating condition, the predecoder YPD functions to decode the complementary internal address signals by combining ay0 with ay1, ay2 with ay3 and av4 relative to every one or two bits thereof, hence forming the predecode signals Y00-Y03, Y20-Y23 and Y40-Y41, respectively. Besides the above, the predecoder YPD also forms array selection signals A1- A8 in accordance with the complementary internal address signals ay6-av8, and further forms left-right selection signals SL and SR in accordance with the complementary internal address signal av5.

The Y address buffer YAB has the same circuit configuration as that of the aforementioned X address buffer XAB, and forms complementary internal address signals ay0-ay9 in accordance with 10-bit Y address signals AY0-AY9 received via the external terminals AY0-AY9. Out of the entire signals thus formed, the complementary internal address signal $\overline{ay9}$ of the most significant bit is fed to the mat selector circuit MSL while the other complementary internal address signals $\overline{ay0}$-$\overline{a8}$ are fed to the predecoder YPD.

The mat selector circuit MSL receives the complementary internal address signal $\overline{ax7}$ of the most significant bit from the X address buffer XAB, and also receives the complementary internal address signal $\overline{av9}$ of the most significant bit from the Y address buffer YAB. The mat selector circuit MSL decodes the complementary internal address signals $\overline{ax7}$ and $\overline{ay9}$ to alternatively turn the mat selection signals M1-M4 to a high level. Such mat selection signals M1-M4 are fed to the corresponding memory mats MAT1-MAT4, respectively.

The write complementary common data lines $\overline{WD1L}$.$\overline{WD1R}$-$\overline{WD8L}$.$\overline{WD8R}$, where the complementary data lines D0.$\overline{D0}$-D31.$\overline{D31}$ or D32.$\overline{D32}$-D63.$\overline{D63}$ of the corresponding memory array are selectively connected by the column switches CS1L-CS8L or CS1R-CS8R, are connected to the output terminals of the corresponding write amplifiers WA. The entire input terminals of such write amplifiers WA are connected in common to the complementary signal lines w.$\overline{w}$ and are further connected to the output terminals of the data input buffer D1B. The input terminal of the data input buffer DIB is connected to the data input terminal Din, and a timing signal $\phi$we obtained from the timing generator circuit TG is fed to the data input buffer DIB.

When the bipolar CMOS type RAM is placed in a write mode, the data input buffer DIB is selectively driven into operation in response to the timing signal $\phi$we. In such an operating state, the data input buffer DIB produces a MOS-level complementary write signal out of ECL-level write data fed from an external unit via the data input terminal Din, and transmits such complementary write signal to the entire write amplifiers WA via the complementary signal lines $\overline{w}$.

The write amplifiers WA are selectively driven into operation when mutually corresponding combinations of unshown array selection signals A1-A8 and left-right selection signals SL and SR are turned to a high level simultaneously. In such operating state, the write amplifier WA selectively transmits a write current, which conforms with the complementary write signal fed from the data input buffer DIB via the complementary signal lines w.$\underline{w}$, to the corresponding write complementary common data lines $\overline{WD1L}$-$\overline{WD8L}$ or $\overline{WD1R}$-$\overline{WD8R}$.

On the other hand, the read complementary common data lines $\overline{RD1L}$.$\overline{RD1R}$-$\overline{RD8L}$.$\overline{RD8R}$, where the complementary data lines D0.$\overline{D0}$-D31.$\overline{D31}$ or D32.$\overline{D32}$-D63.$\overline{D63}$ of the corresponding memory array are selectively connected by the column switches CS1L-CS8L or CS1R-CS8R, are connected to the input terminals of the corresponding sense amplifiers SA. The entire output terminals of such sense amplifiers SA are connected in common to the complementary signal lines r, $\overline{r}$ and are further connected to the input terminal of the data output buffer DOB. The output terminal of the data output buffer DOB is connected to the data output terminal Dout. And a timing signal $\phi$oe obtained from the timing generator circuit TG is fed to the data output buffer DOB.

The sense amplifiers SA are selectively driven into operation when mutually corresponding combinations of unshown array selection signals A1-A8 and left-right selection signals SL and SR are turned to a high level simultaneously. In such operating state, the driven sense amplifier SA selectively amplifies a read signal of a small amplitude transmitted thereto from the selected memory cell MC of the corresponding memory array via the read complementary common data lines $\overline{RD1L}$.$\overline{RD1R}$-$\overline{RD8L}$. $\overline{RD8R}$, thereby producing a logic-level complementary read signal. Such complementary read signals are transmitted via the complementary signal lines r, $\overline{r}$ to the data output buffer DOB.

When the bipolar CMOS type RAM is in a read mode, the data output buffer DOB is selectively driven into operation in response to the aforesaid timing signal $\phi$oe. In such operating state, the data output buffer DOB converts to an ECL level the complementary read signal received from the sense amplifier SA via the complementary signal lines r, $\overline{r}$, and then transmits the level-converted signal from the data output terminal Dout to an external unit via the open-emitter output transistor.

The timing generator circuit TG produces various timing signals on the basis of a chip selection signal $\overline{CS}$ and a write enable signal $\overline{WE}$ received as control signals from external units and feeds such timing signals to the individual circuits.

Figure 5:
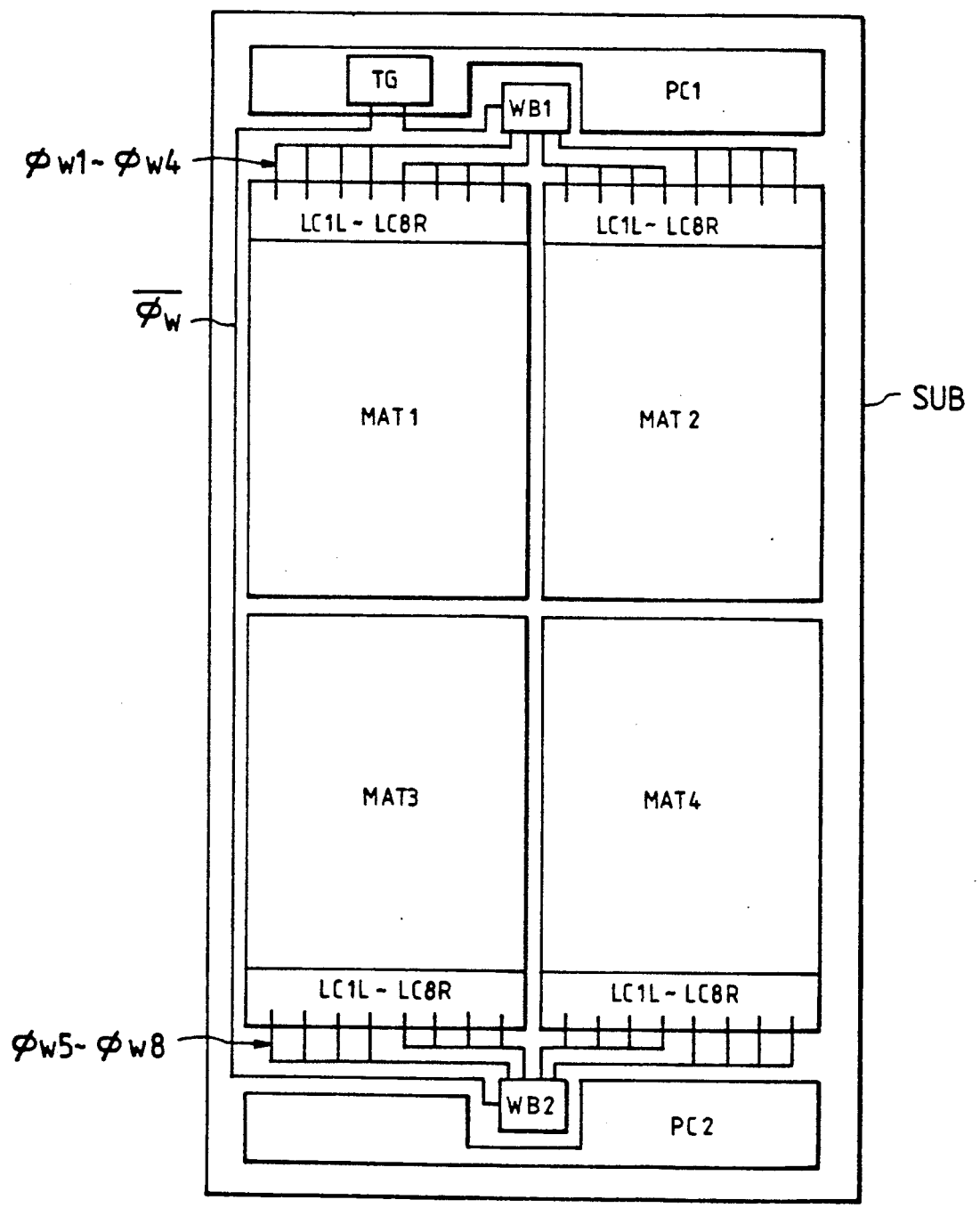
FIG. 5 shows the configuration employing the bipolar CMOS type RAM of FIG. 1.
Figure 6:
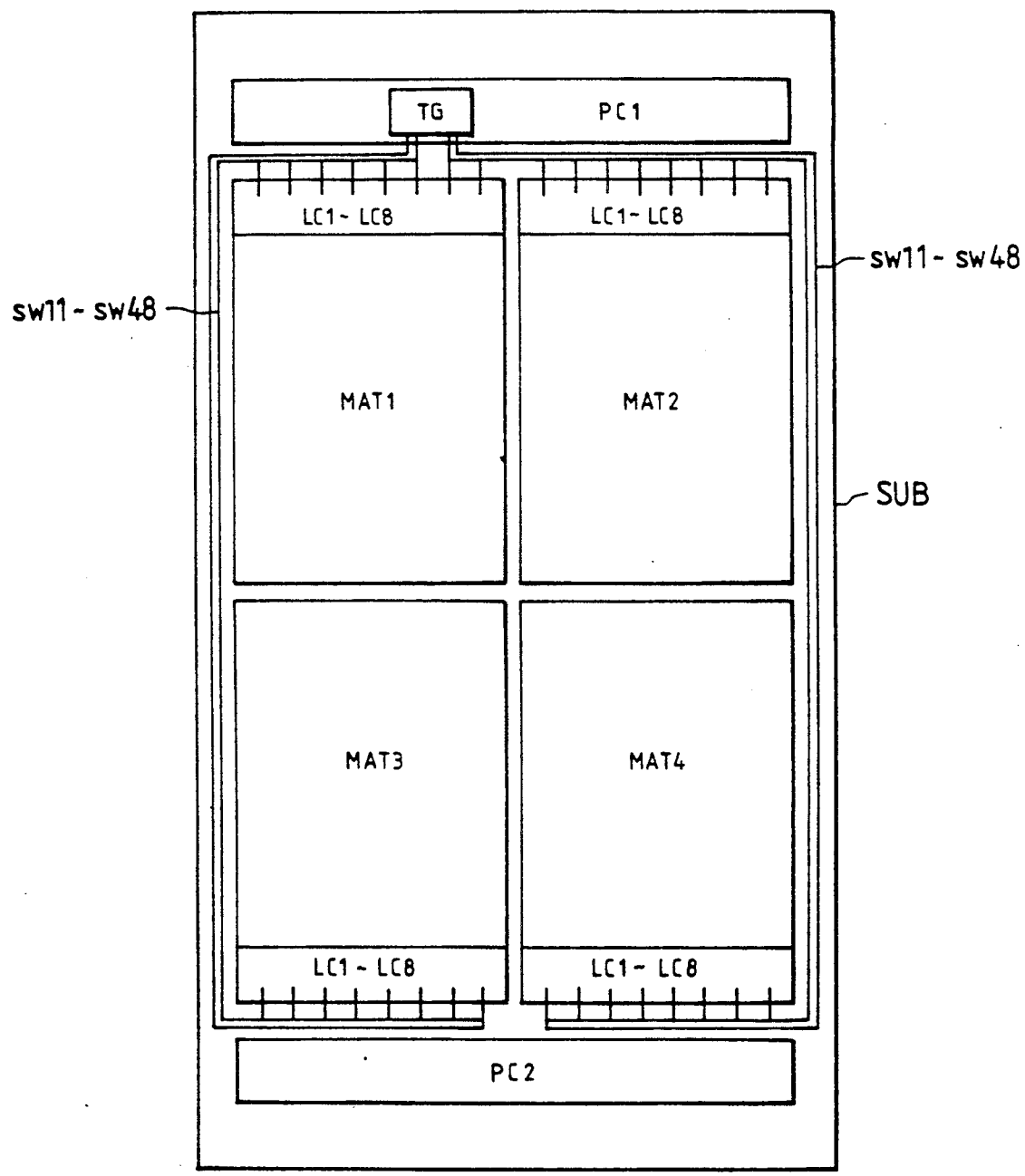
FIG. 6 shows the configuration in a known bipolar CMOS type RAM contrived prior to the present invention.

FIG. 5 shows an example of a configuration employing the exemplary bipolar CMOS type RAM of FIG. 1. In this diagram, the arrangement of the individual circuit blocks is illustrative of one example of a practical arrangement only.

In FIG. 5, the bipolar CMOS type RAM is formed on a single semiconductor substrate SUB of monocrystal silicon, although not particularly restricted thereto. Four memory mats MAT1-MAT4 are arranged in the central area of the semiconductor substrate SUB, and peripheral circuits PC1 and PC2 including address buffers, predecoders and so forth are arranged outside the memory mats. Although not specifically restricted to a particular type, the peripheral circuit PC1 includes a timing generator circuit TG.

Variable impedance load circuits LC1L, LC1R-LC8L, LC8R which are respectively provided to corresponding memory arrays ARY1-ARY8 of each memory mat are disposed in the outermost portions of the corresponding memory mats MAT1-MAT4, respectively. A write control signal buffer WB1 is disposed in the vicinity of an intermediate portion between the memory mats MAT1 and MAT2. Similarly, a write control signal buffer WB2 is disposed in the vicinity of an intermediate portion between the memory mats MAT3 and MAT4.

As a result of the above configuration, the overall distance is reduced between the write control signal and switching signal generator circuits, and also between the switching signal generator circuits and the variable impedance load circuits. Practically the feed paths between the timing generator circuit TG and the individual write control signal buffers WB1 and WB2 are mutually different in length. However, such feed paths are so designed as to be equivalent in length insofar as signal transfer time is concerned by adjusting the number of delay circuits provided in, for example, the timing generator circuit TG. Consequently it becomes possible to minimize the dispersion in the recovery time of the variable impedance load circuits following completion of the write operation, hence diminishing the relative delay time of the write control signal to the start control signal.

At described above, the bipolar CMOS type RAM in this embodiment comprises four memory mats MAT1-MAT4. Each of such memory mats includes eight memory arrays ARY1-ARY8 divided and arranged in the direction of word lines, and eight variable impedance load circuits LC1L-LC8L and LC1R-LC8R are provided each corresponding to an associated one of the memory arrays. Such variable impedance load circuits include 64 pairs of P-channel MOSFETs respectively to disposed corresponding ones of the complementary data lines of the related memory arrays. The P-channel MOSFETs on one side of such pairs are normally kept in an on-state, while the P-channel MOSFETs on the other side are selectively cut off in accordance with the corresponding selection timing signals in the write mode. Switching signal generator circuits W1-W8 are provided in the central portions of the variable impedance load circuits so as to form the aforesaid selection timing signals on the basis of the corresponding array selection signals A1-A8 and write control signals $\phi w1$-$\phi w8$, respectively. Furthermore, write control signal buffers WB1 and WB2 are provided in the central portions of the memory mats MAT1-MAT3 and MAT3-MAT4 respectively so as to transmit the aforesaid write control signals $\phi w1$-$\phi w8$ to the switching signal generator circuits W1-W8 for the related memory mats. The feed paths between such write control signal buffers and the timing generator circuit TG are so designed that the respective transmission delay times become equal to each other, whereby the feed paths are rendered mutually equivalent in length. Accordingly, such configuration minimizes the dispersion in the recovery time of the individual variable impedance load circuits while diminishing the overall length between the switching signal generator circuits and the variable impedance load circuits, hence shortening the cycle time of the bipolar CMOS type RAM equivalently to expedite its operation.

As is obvious in the embodiment mentioned above, when the present invention is applied to a semiconductor memory unit such as a bipolar CMOS type RAM or the like having variable impedance load circuits, the following advantageous effects are attainable.

(1) In the arrangement, signal generator circuits for producing selection timing signals in accordance with predetermined write control signals and corresponding array selection signals are provided in relation to individual memory arrays and feed such signals to a plurality of variable impedance load circuits, and signal relay circuits for transmitting the write control signals formed by the timing generator circuit are provided correspondingly to a predetermined number of the signal generator circuits. Therefore, the feed paths between the timing generator circuit and the signal relay circuits are easily rendered equivalent in length.

(2) Due to the effect of item (1), the overall distance between the signal generator circuits and the variable impedance load circuits can be reduced.

(3) The effects of items (1) and (2) minimize the dispersion in the recovery time of the variable impedance load circuits following to the write operation.

(4) The effects of items (1) through (3) diminish the relative delay time of the write control signal to the start control signal and consequently shorten the cycle time of the bipolar CMOS type RAM or the like having variable impedance load circuits, hence expediting its operation.

Although the invention accomplished by the present inventors has been specifically described hereinabove with reference to the exemplary embodiment, it is to be understood that this invention is not limited to such embodiment alone, and a variety of changes and modifications may be made within the scope not departing from the inventive concept and spirit thereof For example, in the block diagram of FIG. 1, the number of the memory mats or that of the memory arrays in each may is not restricted by the embodiment mentioned Although main word line drive circuits MWD1-MWD4 are provided at a rate of one for eight memory arrays of each mat in the above embodiment, such main word line drive circuit may be provided individually for each of the memory arrays. The X address decoder and the Y address decoder need not be based on the predecoding system entirely, and such predecoding system may be adopted merely partially. Furthermore, the write control signal buffer may be provided for each memory mat, or a plurality of such buffers may be provided for each memory mat. It is desired that, in any of such modifications, the feed paths between the timing generator circuit TG and the individual write control signal buffers be mutually equivalent in length The switching signal generator circuit may be provided in relation to a plurality of memory arrays, or a plurality of such circuits may be provided for each memory array. As for the resistors R1 and R2 constituting each memory cell MC in the circuit diagram of FIG. 2, a P-channel MOSFET may be employed instead of a polysilicon layer. The same data line may also be used as both a write complementary common data line and a read complementary common data line. In the configuration of FIG. 5, each variable impedance load circuit may be disposed inside the corresponding memory mat. In this case, a satisfactory result is achieved by similarly disposing the write control signal buffers WB1 and WB2 inside the memory mat. Moreover, the timing generator circuit TG may be located on the reverse side of the semiconductor substrate SUB, and the memory mats may be disposed in a different arrangement where the horizontal and vertical axes of FIG. 5 are replaced with each other. The lines for feeding an inverted timing signal $\phi w$ therethrough from the timing generator circuit TG to the write control signal buffers WB1 and WB2 may be interposed between, for example, the memory mats MAT1 and MAT3, and between MAT2 and MAT4, respectively. In addition to the above, a variety of other modified embodiments may be implemented with regard to the block constitution of the bipolar CMOS type RAM shown in FIG. 1, the specific circuit configurations of the memory mats, the inverter circuit N3, the NAND gate circuit NAG1 and forth shown in FIGS. 2 through 4, the layout in FIG. 5 and also the combinations of the control signals, address signals and predecode signals.

The above description has been given principally on an exemplary case of applying the present invention to a bipolar CMOS type RAM which belongs to the background technical field thereof It is to be understood, however, that the present invention is not limited to such example alone and may also be applied to some other semiconductor memory unit such as CMOS static RAM where its peripheral circuit is composed fundamentally of CMOS. The present invention is widely applicable to any semiconductor memory unit having at least a variable impedance load circuit, and further to

What is claimed is:

1. A semiconductor integrated circuit device comprising: a first node for receiving a first voltage;
a second node for receiving a second voltage smaller than the first voltage;
word lines;
a pair of data lines;
memory cells of static type coupled to the word lines and the pair of data lines so that each memory cell is coupled to one word line and the pair of data lines;
a variable impedance circuit coupled between the first node and the pair of data lines and controlled such that its impedance becomes relatively high when the device is in a data write-in mode in comparison with its impedance in a data read-out mode, the variable impedance circuit including:
a first pair of P-channel MOSFETs in which the source-drain paths thereof are coupled between the first node and the pair of data lines, respectively, and the gates thereof are coupled to the second node, whereby the first pair of P-channel MOSFETs are turned on in response to the application of the first and second voltages to the first and second nodes, respectively, and
a second pair of P-channel MOSFETs in which the source-drain paths thereof are coupled between the first node and the pair of data lines, respectively, and the gates thereof are coupled to receive a control signal, whereby the second pair of P-channel MOSFETs are turned on in the data read-out mode and turned off in the data write-in mode;
a data input circuit which is activated in the data write-in mode and which includes means for changing a level of either one of the pair of data lines to a level substantially equal to the second voltage;
a data output circuit which is activated in the data read-out mode;
a pair of write data lines coupled to outputs of the data input circuit;
a pair of read data lines coupled to inputs of the data output circuit;
a first pair of N-channel MOSFETs for coupling the data input circuit to the pair of data lines via the pair of write data lines in the data write-in mode; and
a third pair of P-channel MOSFETs for coupling the data output circuit to the pair of data lines via the pair of read data lines in the data read-out mode.

2. A semiconductor integrated circuit device according to claim 1, wherein each memory cell includes:
a pair of MOSFETs each one having its gate and drain cross-coupled to the drain and gate of the other one of said pair of MOSFETs, respectively, a pair of load elements respectively coupled to the drains of the pair of MOSFETs and a pair of transfer gate MOSFETs, each transfer gate MOSFET having its source-drain path coupled between the drain of a respective one of the pair of MOSFETs and a respective one of the pair of data lines, and the gates of both transfer gate MOSFETs are coupled to one of the word lines.

3. A semiconductor integrated circuit device according to claim 2, wherein the load elements include resistors of polycrystalline silicon.

4. A semiconductor integrated circuit device according to claim 3, wherein the semiconductor integrated circuit device is a bipolar - CMOS type memory device.

5. A semiconductor integrated circuit device according to claim 4, wherein the bipolar - CMOS type memory device is compatible with emitter coupled logic.

6. A semiconductor integrated circuit device according to claim 3, wherein the first pair of P-channel MOSFETs of said variable impedance circuit have conductances smaller than that of the second pair of P-channel MOSFETs thereof.

7. A semiconductor integrated circuit according to claim 6, wherein the second voltage is of a potential more negative than the first voltage.

8. A semiconductor integrated circuit according to claim 7, wherein the first voltage is substantially at ground potential.

9. A semiconductor integrated circuit according to claim 8, wherein the pair of MOSFETs that are cross-coupled and pair of transfer gate MOSFETs of each memory cell are N-channel MOSFETs.

10. A semiconductor integrated circuit according to claim 1, wherein the second voltage is of a potential more negative and of greater magnitude than the first voltage.

11. A semiconductor memory device on a substrate comprising:
a first node for receiving a first voltage;
a second node for receiving a second voltage smaller than the first voltage;
a plurality of word lines;
a plurality of pairs of complementary data lines;
a plurality of static memory cells coupled to the plurality of word lines and the plurality of pairs of complementary data lines so that each static memory is coupled to one word line and one pair of complementary data lines;
variable impedance circuits coupled between the first node and the plurality of pairs of complementary data lines so that each variable impedance circuit is coupled between the first node and one pair of complementary data lines, each one of the variable impedance circuits being selectively controlled so as to effect a change in impedance thereacross from a first value to a second value higher than the first value during a write-in mode of operation, each of the variable impedance circuits including:
a first pair of P-channel MOSFETs in which the source-drain paths thereof are coupled between the first node and a corresponding pair of complementary data lines, respectively, and the gates thereof are coupled to the second node, whereby the first pair of P-channel MOSFETs are turned on in response to the application of the first and second voltages to the first and second nodes, respectively, and
a second pair of P-channel MOSFETs in which the source-drain paths thereof are coupled between the first node and the corresponding pair of complementary data lines, respectively, and the gates thereof are coupled to receive a control signal, whereby the second pair of P-channel MOSFETs are turned on in the data read-out mode and turned off in the data write-in mode;
a data input circuit which is activated in the data write-in mode and which includes means for changing a level of either one of the pair of data lines to a level substantially equal to the second voltage;

a data output circuit which is activated in the data read-out mode;

a pair of write data lines coupled to outputs of the data input circuit;

a pair of read data lines coupled to inputs of the data output circuit; and a plurality of switching circuits coupled between the plurality of complementary data lines and the pair of data read and data write lines and each one thereof including:

a first pair of N-channel MOSFETs for selectively coupling the data input circuit to a corresponding pair of complementary data lines via the pair of write data lines in the data write-in mode, and a third pair of P-channel MOSFETs for selectively coupling the corresponding pair of complementary data lines to the data output circuit via the pair of read data lines in the data read-out mode.

12. A semiconductor memory device according to claim 11, wherein each memory cell includes:

a pair of MOSFETs each one having its gate and drain cross-coupled to the drain and gate of the other one of said pair of MOSFETs, respectively, a pair of load elements respectively coupled to the drains of said pair of MOSFETs thereof, and a pair of transfer gate MOSFETs, each transfer gate MOSFET having its source-drain path coupled between the drain of a respective one of the pair of MOSFETs of said memory cell and a respective one of a corresponding pair of data lines, and the gates of both transfer gate MOSFETs are coupled to one of said plurality of word lines.

13. A semiconductor memory device according to claim 12, wherein said load elements include resistors of polycrystalline silicon.

14. A semiconductor memory device according to claim 13, wherein the semiconductor memory device is a bipolar - CMOS type memory device.

15. A semiconductor memory device according to claim 14, wherein the bipolar - CMOS type memory device is compatible with emitter coupled logic.

16. A semiconductor memory device according to claim 14, wherein the second voltage is of a potential more negative than the first voltage.

17. A semiconductor memory device according to claim 16, wherein the first voltage is substantially at ground potential.

18. A semiconductor memory device according to claim 17, wherein the first pair of P-channel MOSFETs of said variable impedance circuit have conductances smaller than that of the second pair of P-channel MOSFETs thereof.

19. A semiconductor memory device according to claim 11, wherein the first pair of P-channel MOSFETs of said variable impedance circuit have conductances smaller than that of the second pair of P-channel MOSFETs thereof.

20. A semiconductor integrated circuit device comprising:

a first node for receiving a first voltage;

a second node for receiving a second voltage smaller than the first voltage;

word lines;

a pair of data lines;

memory cells of static type coupled to the word lines and the pair of data lines so that each memory cell is coupled to one word line and the pair of data lines;

a variable impedance circuit coupled between the first node and the pair of data lines and controlled such that its impedance becomes relatively high when the device is in a data write-in mode in comparison with its impedance in a data read-out mode, the variable impedance circuit including:

a first pair of transistors, each one thereof having a main current path coupled between the first node and the pair of data lines, respectively, and a control terminal coupled to the second node, whereby the first pair of transistors are turned on in response to the application of the first and second voltages to the first and second node, respectively, and a second pair of transistors each one thereof having a main current path coupled between the first node and the pair of data lines, respectively, and a control terminal, the control terminals of the second pair of transistors being commonly coupled to receive a control signal, whereby the second pair of transistors are turned-on in the data read-out mode and turned off in the data write-in mode;

a data input circuit which is activated in the data write-in mode and which includes means for changing a level of either one of the pair of data lines to a level substantially equal to the second voltage;

a data output circuit which is activated in the data read-out mode;

a pair of write data lines coupled to outputs of the data input circuit;

a pair of read data lines coupled to inputs of the data output circuit;

a first pair of MOSFETs for coupling the data input circuit to the path of data lines via the pair of write data lines in the data write-in mode; and a second pair of MOSFETs, of a complementary channel type to that of said first pair of MOSFETs, for coupling the data output circuit to the pair of data lines via the pair of read data lines in the data read-out mode.

21. A semiconductor integrated circuit device according to claim 20, wherein the first pair of transistors of said variable impedance circuit, during conducting states thereof, have conductances smaller than that of the second pair of transistors thereof.

22. A semiconductor integrated circuit device according to claim 20, wherein each of the transistors of the first and second pair of transistors of said variable impedance circuit is a MOSFET in which the source-drain path and gate thereof are the main current path and control terminal thereof, respectively.

23. A semiconductor integrated circuit device according to claim 22, wherein the MOSFETs corresponding to the first pair and second pair of transistors are comprised of MOSFETs of the same channel type.

24. A semiconductor integrated circuit device according to claim 23, wherein the pair of MOSFETs for coupling the data input circuit to the pair of data lines includes N-channel MOSFETs and the pair of MOSFETs for coupling the data output circuit to the pair of data lines includes P-channel MOSFETs.

25. A semiconductor integrated circuit device according to claim 23, wherein the MOSFETs of the first pair and second pair of transistors are P-channel MOSFETs.

26. A semiconductor integrated circuit device according to claim 25, wherein the second voltage is of a potential more negative than the first voltage.

27. A semiconductor integrated circuit device according to claim 26, wherein the first voltage is substantially at ground potential.

28. A semiconductor integrated circuit device according to claim 27, wherein the semiconductor integrated circuit device is of a bipolar-CMOS type memory device.

29. A semiconductor integrated circuit device according to claim 27, wherein the MOSFETs of the first pair of transistors of said variable impedance circuit have conductances smaller than the MOSFETs of the second pair of transistors thereof.

30. A semiconductor integrated circuit device according to claim 20, wherein at least the first pair of transistors of said variable impedance circuit includes a pair of MOSFETs in which the source-drain path and gate thereof are the main current path and control terminal thereof, respectively.

31. A semiconductor integrated circuit device according to claim 30, wherein the MOSFETs of the first pair of transistors of the variable impedance circuit are P-channel MOSFETs.

32. A semiconductor integrated circuit device according to claim 30, wherein the second pair of transistors of said variable impedance circuit include bipolar transistors.

33. A semiconductor integrated circuit device according to claim 32, wherein the MOSFETs of the first pair of transistors of the variable impedance circuit are P-channel MOSFETs.

34. A semiconductor integrated circuit device according to claim 33, wherein the pair of MOSFETs for coupling the data input circuit to the pair of data lines includes N-channel MOSFETs and the pair of MOSFETs for coupling the data output circuit to the pair of data lines includes P-channel MOSFETs.

35. A semiconductor integrated circuit device according to claim 34, wherein the second voltage is of a potential more negative than the first voltage.

36. A semiconductor integrated circuit device according to claim 35, wherein the first voltage is substantially at ground potential.

37. A semiconductor memory device on a substrate comprising:
a first node for receiving a first voltage;
a second node for receiving a second voltage smaller than the first voltage;
a plurality of word lines;
a plurality of pairs of complementary data lines;
a plurality of static memory cells coupled to the plurality of word lines and the plurality of pairs of complementary data lines so that each static memory cell is coupled to one word line and one pair of complementary data lines;
variable impedance circuits coupled between the first node and the plurality of pairs of complementary data lines so that each variable impedance circuit is coupled between the first node and one pair of complementary data lines, each one of the variable impedance circuits being selectively controlled so as to effect a change in impedance thereacross from a first value to a second value higher than the first value during a write-in mode of operation, each of the variable impedance circuits including:
a first pair of MOSFETs in which the source-drain paths thereof are coupled between the first node and a corresponding pair of complementary data lines, respectively, and the gates thereof are coupled to the second node, whereby the first pair of MOSFETs are turned on in response to the application of the first and second voltages to the first and second nodes, respectively, and
a pair of transistors each one thereof having a main current path coupled between the first node and the corresponding pair of complementary data lines, respectively, and a control terminal, the control terminals of the pair of transistors being commonly coupled to receive a control signal, whereby the pair of transistors are turned on in the data read-out mode and turned off in the data write-in mode;
a data input circuit which is activated in the data write-in node and which includes means for changing a level of either one of the pair of data lines to a level substantially equal to the second voltage;
a data output circuit which is activated in the data read-out mode;
a pair of write data lines coupled to outputs of the data input circuit;
a pair of read data lines coupled to inputs of the data output circuit; and
a plurality of switching circuits coupled between the plurality of complementary data lines and the pair of data read and data write lines and each one thereof including:
a second pair of MOSFETs of a first channel type for selectively coupling the data input circuit to a corresponding pair of complementary data lines via the pair of write data lines in the data write-in mode; and
a third pair of MOSFETs of a second, complementary channel type, for selectively coupling the corresponding pair of complementary data lines to the data output circuit via the pair of read data lines in the data read-out mode.

38. A semiconductor memory device according to claim 37, wherein the first pair of MOSFETs of each variable impedance circuit are P-channel MOSFETs.

39. A semiconductor integrated circuit device according to claim 38, wherein the pair of transistors of each variable impedance circuit are comprised of bipolar transistors.

40. A semiconductor integrated circuit device according to claim 37, wherein the pair of transistors of each variable impedance circuit are comprised of bipolar transistors.

41. A semiconductor integrated circuit device according to claim 38, wherein the pair of MOSFETs for coupling the data input circuit to the pair of complementary data lines includes N-channel MOSFETs and the pair of MOSFETs for coupling the data output circuit to the pair of complementary data lines includes P-channel MOSFETs.

42. A semiconductor integrated circuit device according to claim 41, wherein the second voltage is of a potential more negative than the first voltage.

43. A semiconductor integrated circuit device according to claim 42, wherein the first voltage is substantially at ground potential.

44. A semiconductor integrated circuit device according to claim 43, wherein the pair of transistors of each variable impedance circuit are comprised of bipolar transistors.

45. A semiconductor integrated circuit device according to claim 37, wherein the first pair of MOSFETs of each variable impedance circuit have conductances smaller than that of the pair of transistors thereof.

* * * * *